(12) United States Patent
D'Agostini (10) Patent No.: US 6,894,681 B2
(45) Date of Patent: May 17, 2005

(54) CHARACTER INPUT DEVICE BASED ON A TWO-DIMENSIONAL MOVEMENT SENSOR

(76) Inventor: Giovanni D'Agostini, Via G. Giusti 17, I-33100 Udine (IT)

(*) Notice: Subject to any disclaimer, the term of this patent is extended or adjusted under 35 U.S.C. 154(b) by 568 days.

(21) Appl. No.: 09/963,249

(22) Filed: Sep. 26, 2001

(65) Prior Publication Data

US 2002/0060699 A1 May 23, 2002

Related U.S. Application Data

(63) Continuation of application No. PCT/IT01/00041, filed on Jan. 25, 2001.

(51) Int. Cl.[7] ................................................ G09G 5/08
(52) U.S. Cl. ........................ 345/173; 345/169; 178/18.1
(58) Field of Search ................................. 345/168, 169, 345/173, 174, 175, 176, 177, 178, 179; 178/18.01, 18.1, 19.01; 341/20, 22, 23

(56) References Cited

U.S. PATENT DOCUMENTS

| | | | |
|---|---|---|---|
| 4,458,238 A | * 7/1984 | Learn ........................... | 341/20 |
| 5,388,922 A | 2/1995 | Smiley | |
| 5,543,818 A | * 8/1996 | Scott ........................... | 345/168 |
| 5,748,512 A | * 5/1998 | Vargas ......................... | 708/142 |
| 6,016,142 A | * 1/2000 | Chang et al. ................ | 345/763 |
| 6,031,525 A | * 2/2000 | Perlin .......................... | 345/173 |
| 6,094,197 A | * 7/2000 | Buxton et al. ............... | 345/863 |
| 6,271,835 B1 | * 8/2001 | Hoeksma .................... | 345/168 |
| 6,295,052 B1 | * 9/2001 | Kato et al. ................... | 345/179 |
| 6,580,414 B1 | * 6/2003 | Wergen et al. .............. | 345/156 |
| 6,597,345 B2 | * 7/2003 | Hirshberg .................... | 345/168 |

FOREIGN PATENT DOCUMENTS

| | | |
|---|---|---|
| EP | 0 294 518 | 12/1987 |
| EP | 0 820 001 | 7/1997 |
| EP | 0 844 571 | 11/1997 |
| WO | WO 99/34574 | 12/1998 |

OTHER PUBLICATIONS

Scrolling Keyboard for Three Key Input of Alphanumeric Characters Feb. 1997, 3 pages.

* cited by examiner

*Primary Examiner*—Xiao Wu
(74) *Attorney, Agent, or Firm*—St. Onge Steward Johnston & Reens LLC (57) ABSTRACT

A character input device controlled by microprocessor providing: the replacement of the writing alphanumeric keyboard, with an auto-writing device including a movement sensor according to the X, Y coordinates with respect to a surface associate/able to said microprocessor that controls a monitor/screen, in which: with vertical or predominately vertical movements according to the "Y" ordinates, allow changing, in scrolling a way, the alphanumeric characters of interest, so that, when the movement stops or changes direction the desired alphanumeric character remains on the screen; with horizontal or predominantly horizontal movement, according to the abscissas "X" axis, in the sense of advancing writing, at least the addition of said alphanumeric characters can be operated. Cancellation is made with a backwards movement. The system is useful for writing on cellular phones, palmtops, TV and computers, without keyboard or alternatively to it.

31 Claims, 5 Drawing Sheets

CHARACTER INPUT DEVICE BASED ON A TWO-DIMENSIONAL MOVEMENT SENSOR

This application is a continuation of pending International Application No. PCT/IT01/00041 filed Jan. 25, 2001, designating the United States and claiming priority of Italian Patent Application Nos. UD2000A000014 filed Jan. 26, 2000, UD2000A000041 filed Feb. 24, 2000 and UD2000A000084 filed Apr. 18, 2000.

FIELD OF THE INVENTION

This invention has for object a screen auto-writing system and method controlled by microprocessor and respective devices and apparatus with said system and method.

The hardware using said method and system, such as cellular-phones, telephones, computers, also form object of this invention.

1. Technical Field

This invention is preferably, even if not exclusively, applied in computers, cellular-phones and telephones in which a writing keyboard is usually necessary; also the televisions can be equipped with such auto-writing system.

2. Background Art

In prior art the need to use an alphanumeric keyboard to write, therefore both for numbers and letters in the cellular-phones, telephones, computers and monitors and eventually televisions is known.

The keyboard presently used includes a plurality of key-caps on which the letter and/or number to type is written.

The system is practically similar to the old mechanical typewriters.

Nothing has changed for years, that is since the typewriter has been invented, other than now, pressing a character key determines a function to the processor to write the correspondent letter or number on the screen. Therefore, whilst before the transmission of the control determined by the pressure of the alphanumeric key was mechanical (now it is electric).

This type of writing system with keyboard, has the drawback of:

having to realize as many types of keyboards as are the languages and countries with different characters in the world. For example, there is an Italian keyboard, an English keyboard, a French keyboard, a Spanish keyboard, a German keyboard, a Portuguese keyboard, a Russian keyboard, a Greek keyboard, a Chinese keyboard, a Japanese keyboard, an Indian keyboard, an Arabian keyboard, etc.

the costs are very high for the aforementioned diversification;

the costs are also high for the keyboard mechanical complexity (a lot of key-caps);

In the cellular-phones (but also in the telephones) the numerical keyboard is encumbering, is not visible at night (or energy to illuminate it must be provided) and to write letters, one must repeat several times the same key caps in a complicated, long and tedious manner, so if one mistakes the number of repetitions, one mistakes the letter, with the consequence that to write a message (FAX or Email) particularly for example on the cellular-phone or telephone or to find a telephonic number with Name, becomes a difficult task.

Further the keyboard causes accumulation of dust and dirt, so that it gets frequently clogged and the keys, particularly of the cellular-phones remain pressed-down, locking the functioning.

The liquids fall on the keyboard, damaging it in an irreversible manner.

The bulk, as mentioned, is always relevant and prevents the miniaturizing.

Alternative Solutions Exist:

For the above mentioned problems, different ways to eliminate the keyboard were tried, in particular the use of electronic pens associated with a position sensor panel (screen or panel), sensitive to the presence of said electronic pen or other object (eg; a finger) that detects the position and relative movement of it in a graph manner, associated with functions that recognize the drawing made to identify it, if it regards an "a", a "b", a number, etc.

These solutions demonstrated to be very long and difficult to be managed, so much so that they were a complete failure, not only because each person writes in a different manner (example "a" can be written clockwise or counter-clockwise, with a longer or less long leg, with a closed or open circle, Etc. Additionally the same "A" (capital) is written in a different manner etc., but also for the complexity of the characters shapes.

Therefore the problem remains.

Other attempts were made with the so-called "touch-screen" in which the screen is touched, but this system did not have success other than as operative control, like the traditional "mouse".

The use of the current mouse is more advantageous in computer systems, both for the control function and correction of the writing already done by the keyboard input. The common mouse is confined since now to be associated with the keyboard.

When one writes on the keyboard, both hands are busy and during this time one cannot use the mouse.

Alternatively when the mouse is used, a hand is engaged and only the other hand may be utilized to strike the keyboard's alphanumeric writing key-caps, therefore making the process slow.

Further, when one strikes on the keyboard, the drawback to press inadvertently two key-caps causing an error often occurs, which often determines the block of the operating system.

The use of covered keyboards or "touch" keyboards that is to press or to simply touch, solves the problem of the dirt, damage by liquids, etc., but always has the problem of the great variety of keyboards on which the letters and the numbers are written.

Auto-writers other than those utilizing means for the words pronunciation recognition "speech recognition" or for the graphic recognition of drawings corresponding to the letters that one wants to write are not easy used. These last solutions are complicated, primordial and slow, so much so that they have a very limited use.

Nowadays we still use predominantly a keyboard traditional writing means, but Keyboard use is cumbersome. While one looks at the keyboard one cannot look at the writing field, so the errors increase, etc.

Purpose of the Invention

The purpose of this innovation is to avoid the above-mentioned drawbacks.

Essence of the Invention

The problem is solved as claimed in claim 1, namely by a screen auto-writing system controlled by microprocessor characterized in that it provides:

the replacement of the writing alphanumeric keyboard, with an auto-writing device including a movement sensor according to the X,Y coordinates with respect to a surface, associated/able to said microprocessor that controls said monitor or screen, in which:

with vertical or predominantly vertical movements according to the Y ordinates allow changing in a scrolling way of the alphanumeric characters of interest, so that, when the movement stops the desired alphanumeric character remains on the screen;

with horizontal or predominantly horizontal movement, according to the abscissas X axis, in the sense of advancing writing, at least the addition of said alphanumeric characters can be operated.

In this way, by a mouse or a finger sensor pad, one can write any character/s, and words and sentences, without the need of virtual or physical keyboard, and without having to dictate and without having to design the character to write.

Above all, such a device becomes universal for any writing and character or language, as the ase can reside into the program or operating system, not requiring a different alphanumeric keyboard as in usual systems.

Advantageously, the system provides that in the prevailing movement according to the X-abscissas axis, in the advancing direction alphanumeric characters and punctuation are added and in the opposite direction, that is backwards, cancellation is allowed.

In this way, with a simple upwards and downwards relative movement (coordinates Y) character changing is made, with advancement or backwards movement (X abscissa) one writes and cancels respectively.

With as much advantage, the program being controlled by the microprocessor, being able to know what has already been written, provides the automatic conversion of the numerical value of "numtochar" ordinate in a suitable character (Eg. capital letter at the beginning of paragraph, after the dot ".", colons ":" etc. or small letter, reducing the operative times and possibility of errors).

Advantageously an integrated dictionary is provided to guide the writing, comparing what is written to the prefixes of the existing words in dictionary proposing alternatives only of following characters, and when the word is identified as single suffix proposes finally it in self-writing. In this way further reduction in writing time and avoiding grammatical and typewriting errors is provided.

Advantageously said movement sensor is a "keypad" that is a sensor small panel of the movement of the rested finger and made to slide over it.

In this way the dimension and encumber are minimized, so the problems of dust and dirt accumulation are eliminated, the sealing can be tight and the duration unlimited, it being without mechanical parts, but having only an underlying set of contact/presence electric detectors.

With the above-explained system operator look at the screen only and all the drawbacks of the alphanumeric key-caps (keyboards) are obviated, and it is also possible writing at night because the vision of the lighted screen (eg. Cellular-phone or computer) is sufficient.

Practicing the movement of the finger (preferentially the thumb) is very easy and intuitive and precise mainly if the panel is held with the other fingers from beneath (cellular-phones).

A forward wider or faster displacement advantageously provides, according to this invention, the automatic detachment of a word from the other (space adding).

Option and Shift control Keys can be provided for alternating capitals, respective punctuation, etc.

If in the cellular phones and telephones or televisions a "keypad" is advisable, with the computer one can use a traditional "mouse" or ball sensor in place of said "keypad".

The option functions are preferentially at least:

"mousedown"= sending of signal of the just pressed key;

"mousestilldown" sending a repetitive and continuous signal of still pressed key;

"mouseup"= sending a signal of just raised key (released)

"mouseStillUp"= sending a mouse repetitive and permanent signal with the still raised key;

"mousewithin" sending a presence continuous signal of the mouse indicator inside the desired field, example writing field inside of a screen window having also other functions.

In this way the mouse, besides carrying out the present and traditional functions suitable for the computer management, can therefore if activated, also carry out the aforementioned auto-writing function, on the basis of simple movements of the same that do not configure any form of character but only upwards and downwards and forwards and backwards movements, obviously also in a tilted manner, providing incremental functions of the prevailing movement.

Advantageously the auto-writing system and respective auto-writer is realized by detecting and responsive means to detect relative sliding of the relative movement of an element, as regards the X,Y orthogonal coordinates wherein:

said element has the dimension for being contained in one hand's palm;

said system comprising at least:

means to detect the relative movement on the co-ordinates: horizontal abscissas and vertical ordinates (X,Y) for:

adding characters if the displacement is in addition or on the contrary canceling them, on the prevailing movement according to the "X" horizontal abscissas;

varying the character respectively, number or letter, in relation to the movement according to the "Y" vertical ordinates;

option means to write alternatively letters or numbers;

control means to activate at least two successive points of the sliding movement in association with the relative position on "X1, Y1; X2, Y2" co-ordinates to decide if varying the number or letter or adding or canceling one of them;

the aforementioned means being associable with storage means of at least two characters written in the case of letters and limiting means of the variety of the letters to be written in relation to the characters already previously written.

In this way the great advantage of, simplifying the system, reducing its size and greatly reducing the variability of the letters as regards the numbers approaching this variability to that of the numbers is obtained. For example after having written two consonants, compulsorily the system can impose the choice of a vowel (only 5 variables), etc.

(eg. For Italian: "att" or "attr" where a vowel can be provided only)

Advantageously the self-writer includes a panel responsive to the thumb sliding and it is shaped to have said optional controls at least on a side opposite to the hand's palm that holds the auto-writer, to be controlled by the fingers, forefinger and/or middle finger and/or annular finger, while the thumb is intended to scroll on said panel, upwards and downwards to vary the characters and forwards to add them and backwards for canceling them.

Advantageously, option and control push-button controls, over and/or under said sensitive panel, to be operated by said thumb are provided.

In this way the self-writer becomes a complete very small keyboard or complete remote control with any control function, on the hand's palm, both for computer and for television, also integrated on cellular-phone, and for modem, etc., not requiring anymore support planes.

Alternatively said remote control includes at least a microprocessor, writing storage means and management means of the same with displayer of what written and sending and receiving means.

In this way the auto-writer becomes independent as a palmar computer or even with function of cellular-phone able to send messages, both by fax and Internet, being obviously able to work also when a connecting wire to the telephone line as in the traditional cellular-phones is missing.

A preferred solution provides an auto-writing system with memory means of at least one writing dictionary associated with microprocessor and at least one movement sensor means, at least for sending control signals to a screen to show a moving pointer, and means sensible to detection of said pointer movement in respect to orthogonal co-ordinates X,Y of the screen, on which to wherein:

said movement sensor means has a dimension which can be contained in one's palm of the hand;

and said system includes at least:

means to detect the relative sliding movement of said sensor means on a plane or vice-versa of a finger that slides on a plane of said sensor means or that moves a ball on said sensor means to change said movements into a virtual pointer moving on said screen in the writing area, in order that:

with prevailing movement according to horizontal abscissas "X";

characters are added if the displacement is in the direction of addition to the writing and characters are inversely cancelled;

with prevailing movement according to the vertical ordinates "Y" the characters will be made to vary increasingly if downwards and decreasingly if upwards;

option means to write alternatively letters or numbers;

control means to activate at least two successive dots of the sliding movement in association with the relative position on said co-ordinates "X1, Y1; X2, Y2" to decide if to vary the written character or to add one or to cancel it;

control means to bring continuously up to date the position of said pointer on the screen with the aim to feel its relative movement;

and in which in the case of letters the aforementioned means are associable to:

memorizing means of the already written characters, and comparison means of the sequence of the characters 1 to n of what already written at least of the last word with the words of the dictionary in memory M, and:

select only the words of the dictionary M that begin exactly with the characters from 1 to n of what is already written;

memorize this group of words M1 generally lower than the former M;

and memorize the not repetitive sequence of the characters n+1 of this reduced group of words M1, for automatically, during said movement of said sensor means according to the ordinates "Y", writing one or the other of these letters as reduced variables with respect to the complete alphabet by said movement "Y" selection;

repeat the process with addition of letters by means of said movement "X" and respective selection of the new reduced set "M2" . . . "Mn" until the reducing action of the alternative dictionary words Mn is identified with only one alternative for the automatic completion of the word in writing.

In this way there is the great advantage to reduce enormously the selection of the variable characters to be chosen, which are identified solely with those of the usual practice words in the word context, avoiding errors and making:

not only possible the automatic completion of the word writing by the computer itself, when it is the only alternative, but also, the writing of only of the usually possible characters allowed by the dictionary included into the system, obviously being possible exceptions by option command.

So for example if one wants to write "abdicare":

after having selected "a" as first character of the word, the computer proposes the sole characters used after the "a" (that are not all those of the alphabet but in lower number);

when selected the next character eg "b" (therefore already written "ab") the computer will allow the options solely for the successive possible characters (n+1) of the dictionary, eg.: "a", "b", "d", "i", etc, therefore a number decidedly lower than alphabet letters;

choosing therefore "d"="abd", the computer will allow solely the following possible alternative of "i" and "u";

if one chooses "i"="abdi", the computer will propose finally solely the only alternative "c"="abdic" in this case the computer continues to propose the two subsequent alternatives (a,h);

choosing the alternative "a"="abdica", therefore on simply advancing the relative movement in forward direction (contrary to the known solutions that propose the whole word), the computer will propose solely the alternative of the variables of the characters (n+1) in logical succession following the movement and not without movement of the pointer, eg: "m", "n", "r", "s" "t", "z" of the further reduced group of possible words of the dictionary remaining (abdicammo, abdicando, abdicano, abdicare, abdicarono, abdicasti, abdicate, abdicato, abdicazione) excluding the others (abdicherai, abdicheremo, abdicherete, abdicherò, abdichiamo, abdico, ecc)

choosing finally the "r" "="abdicar", the computer will automatically complete the word with "abdicare", as single solution but always with the operator's consent, that is by the forwards (leftwards) movement of the pointer.

A greater and fastest displacement will determine the space for the forming of a new word, etc.

The pointer (eg by "mouse" or finger) movement is consequently an instinctive movement, automatic and fast of the operator that shifts it forwards to add characters, shifts it backwards to cancel them, downwards and upwards to vary the character.

After a bit of practice one writes swiftly like on the keyboard and with no possibility of mistakes as everything is controlled by the computer.

Obviously one can also derogate from these rules and memories by option key-caps.

This occurs under the constant and continuous control of the writing by the operator by means of the sensor (pointer) means movement.

Advantageously in relation to what is written, at least concerning the word in writing progress and at least the former word, the completion of the word in writing progress or at least the limitation of the subsequent possible options is carried out depending on both.

In this way the great advantage, to simplify the writing system and to further reduce the variability of what has still to be written, or even completing the writing in progress because the computer decides if it is an adjective or substantive or verb is obtained. eg. if the penultimate word is an article or the penultimate word is a pronoun etc. the choice of the subsequent words is further limited etc.

An additional solution with or without use of dictionaries is aimed at the phonetics limitation in function of the language, therefore at proposing only the variety of characters that are probable in the selected language.

Thus for example if the former word is "lo" and the word in writing progress is "ma", the prevailing addition of the next character will be limited to "n, l, i", and few others, because other characters would be not phonetically probable, therefore with this obviously outgoing from the dictionary, the option of the next character to be written is equally sped up, with respect to the whole alphabet variability, and then, if for example the "n" is confirmed ("io man") the final choices are further reduced for the whole word (io maneggio, io mangio etc), for then finally adding the "g" (io mang) the system will be able to complete, during advancing of the pointer, with the writing: "io mangio". These two systems can obviously and advantageously, be integrated with one another.

In this way it is understood that writing errors are avoided and above all the writing is sped up because it is the computer that understands and proposes completion the word at least in function of what is already written and this in an intelligent manner, as the memorized dictionary will identify that the former word "io" is a pronoun corresponding to the first singular person and therefore after it the already written "mang" couldn't be other than a verb that had to be conjugated with "mangio".

In conclusion this means to make the computer intelligent and able to have the possibility of making a reasoning similar to that of a man (human-being).

Obviously these reasoning that the computer with this innovative concept is made able to do according to the system can vary without anyway getting out of the claimed method.

To speed up the system, as suggested before, at least "Option-Means" or "Option-key means" or "Option Sensor Direction" based on the movement direction change for the numbers and characters alternation, capital and small letters, cancellation, etc. can be provided.

Equally advantageously the option means provide the division of the alphabet letters variables between vowels and consonants, in such case the writing action becomes much faster as the variables are almost halved. This latter solution is greatly advantageous because for example one must not scroll all the letters from "a" to "z", (a very long operation) but in a case one will have only the vowels options and in the other only the consonants options and in the other only numerals.

So for example in the variable set by the dictionary probabilities in case of the auto-writing as above mentioned of the word: "abdicare":

to write "a" one will have only the vowels variables, and to write "b" only the consonants variables of the concerned language (eg. Italian): "bcdfglmnpqrstvz"=(15) instead of the total variables of the concerned language: "bcdefgilmnopqrstuvz"=(19). In fact in this case the vowels are further discarded: "eiou", further speeding up the system;

when: "ab" is written the computer will allow the options solely for the successive possible characters (n+1) of the dictionary, eg.: "abdi": with the vowels/consonants option it will have either "abd" or "i": (eg: "aba, abb, abd, abr" or "abi"). Solely as the other vowels are little probable. Of course an option will allow the derogation of what has been above mentioned or the wanted change of what was proposed.

Proceeding in this way one arrives more quickly to the word that one wants to write, that is "abdicare".

It is clear therefore that with that system one further reduces the variables at least from 25 to 30%, which further speeds up the system.

Equally advantageously, but useful only for large-size monitors, for example of computer, one could use a virtual reticulation as sensor of the letters and also the first couple of letters. In such case the combined system could be further sped up.

Tests demonstrated that in this way writing better and without errors is possible, but above all one writes with a number of characters selection variability considerably minor with respect to that necessary for example for the first word character, and additionally the characters options that are added become progressively further limited.

In most cases with said system, one will move much less the "mouse" upwards and downwards and more forwards with more rapid and correct, writing. If the result proposed by the computer is not that wanted, it is sufficient moving back horizontally to cancel characters until the correct writing point and propose the desired variable again for then proceeding again onwards, but this always making the mouse scroll and without striking any writing key.

For the palmars and the cellular-phones and remote-controls, advantageously the auto-writer includes a panel sensitive to the thumb sliding and it is shaped to have said optional controls at least on a side opposite to the palm of the hand which holds the auto-writer, to be controlled with the fingers, forefinger and/or medium and/or annular finger, while the thumb is to slide on said panel, upwards and downwards to vary the characters and forwards to add them and backwards to cancel them.

Some option and/or control push-buttons are provided, on and/or under said sensible panel, which are able to be operated with said thumb. In this way the auto-writer also acts as keyboard or complete remote-control with any control function, on the hand's palm, both for computer and for television, for cellular-phone, and for modem, etc.

BRIEF DESCRIPTION OF DRAWINGS

These and other advantages will appear from the following description of some preferred, not limitative, embodiments, with the aid of the included drawings, whose details are not to be considered limitative but only given as an example.

FIG. 1D is a schematic view of a computer without keyboard to control the computer and to write by the new auto-writing system.

Figure 1:
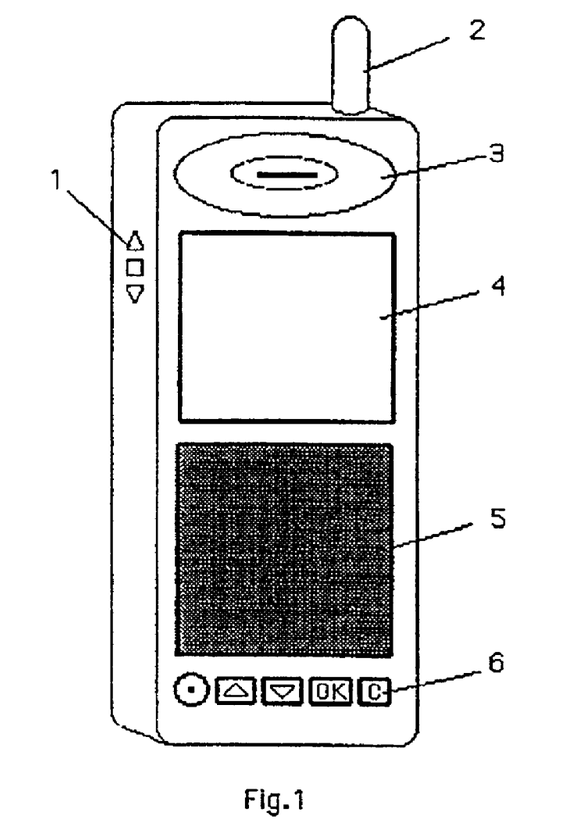
FIG. 1 is a view of a cellular-phone without writing keyboard.
Figure 1A:
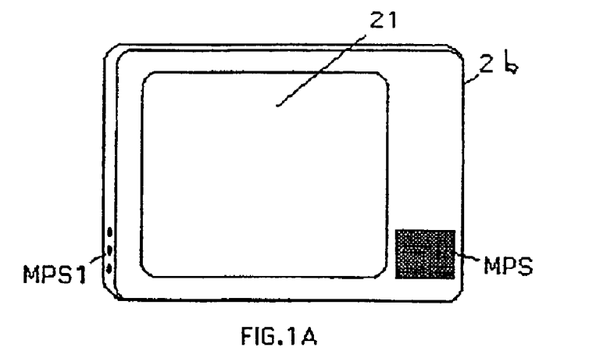
FIG. 1A is a view of a digital monitor (eg. LCD) with integrated computer or connectable with computer that incorporates on its screen side the respective writing device, to carry out the writing with the thumb, while the option control means are placed on the other side, sideways, in order to be operated with the other hand.
Figure 1B:
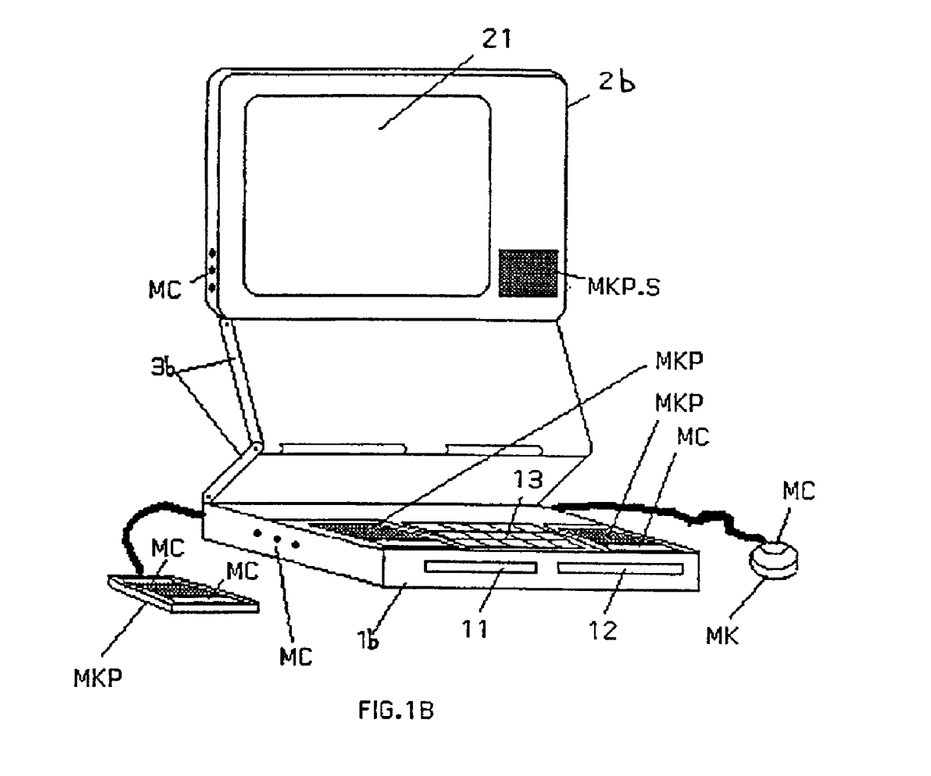
FIG. 1B is a view of an integrated computer with the monitor adjustable in height and orientatable as in previous figure, in which assembly or connection alternatives of the writing system according to this innovation are shown.

Details of FIGS. 1, 1A, 1B

Referring to FIG. 1 one can notice a cellular-phone in which the writing keyboard has been replaced by a "keypad" small board (5), said keypad being the sensor of the position and displacement of the finger, (sliding thumb), while the palm of one's hand grips the cellular phone and the forefinger and/the middle finger can operate from the opposite side the option key-caps on the cellular-phone (1).

In this way writing also at night, both numbers and words and sentences, not only for searching, but also for access to Internet, for sending E-mail, Fax, etc is noticeably much easier. Additionally there not being any writing key-cap, less attention is necessary, the activation of the characters can also to be matched with a different low-sharp tonality, to facilitate the writing.

Other control key-caps (on and off) and "scrolling" functions =sliding can always be provided (6) being irrelevant for the purpose of this invention.

In fact with the option keys 1 always in association with said "keypad", one can also obtain this sliding (movement according to the Y ordinate) and in the movement along the abscissa (X") toward and backwards.

Cellular-phone can or need not have the antenna 2 according to known art.

It is anyway essential the presence of the lightable screen (4) on which the desired characters will appear for selection.

FIG. 1A shows a laptop computer (2b), with, flat LCD screen (21), that in this case does not need a book-like closure like the now existing ones to cover the keyboard, whereby it becomes less heavy, less encumbering and less complicated, therefore cheapest.

It essentially comprises the microprocessor integrated in its logical card that manages the digital screen generally of known art by active matrix or other equivalent not excluding the plasma (21), on a lower side the claimed self-writer "keypad" (MPS) to be hold with the hand as for said cellular-phone, while the inch in a precise manner carries out the writing shifts.

The other hand being able to be free to operate the control and function key-caps (MPS1) on the opposite side.

Obviously the "keypad" self-writer may be put in any suitable position, for example in palmar computers, it will have the position like in the cellular-phone and therefore analogous shape with "keypad" auto-writer means underlying the monitor.

In the solution of FIG. 1B, a "desktop" computer, that is a desk one, that includes an LCD flat screen (2b) of the type shown in FIG. 1A and having controls in the same position (MPF1, MPS) so that they can be easily operated by hand with the elbows are rested on the desk: a hand on the left (on the MPS1), and a hand on the right (on the "keypad" MPS self-writer so that the thumb can write) is shown.

The two-panels articulation (3b), is useful to bring the screen at eye level (21), thus avoiding the back pain caused by a long stay in wrong position.

In the same figure the "keypad" (auto-writer) means is wire-connected (MPK), it can be hold in the hand like a cellular-phone or like a palmar, that is in the hand's palm and using the thumb for writing, being the option control buttons positionable sideways (MC).

The computer may also provide a base (1b) with "drivers"/readers (11,12) and at least one "keypad" auto-writer means (MKP) self-writer panel. Placed on the side for the preferential activation by the thumb, for writing as above explained.

The base may also according to known art contain some key-caps (13) of function, option and control, start, reset, restart means, etc.

Providing two (MKP) "keypad" (pseudo-writer) means, one for each side, one can write much more faster, because one can for example write the numbers and the punctuation and the other one the letters, etc. in any desired combination in function of option key-caps (13).

Also a mouse (MK) with respective activation control button/s, UP, Down, etc. can be provided, (MC).

By the carried out experiments the inventor checked that by simple programming for determined fields and displacement differentials about X,Y, coordinates, one can write without keyboard without great difficulties, obviously the writing speed will be in function of the practice and of the self-directional functions supplied by the program.

The experimental example has been carried out with the following parameters on MAC computer operating system 8.5, PowerPC G3 processor at 400 MHz:

vertical displacement field (Y) according to the ASCII Table (characters to numbers ="chartonum":

letters from "a" to "z"=97–122

Corresponding Capital letters, subtraction of 32 (to the above field);

Numbers from "0" to "9"=48–57

Obviously the inverse in the values from number (field relative co-ordinate) to character ="numtochar".

Similarly the punctuation being able to be numerically integrated or associated according to numerical values from 32 to 47 (=for the space =" ", . . . comma ",", dot ".", etc, until the "/".

Similarly is for the accent or shape variations to the alphabetic characters as for example for "a": "à", "á", etc. or other variations as for example "ñ", "ü", etc. etc. that are identifiable according to ASCII from the number 128 on.

For giving value to these writing parameters, it will therefore be sufficient to impose the oscillation field within said numeral values and/or convert it.

In such case, the oscillation of the movement for example for the letters (higher number of variations) was demonstrated in the range of a ten millimeters, so that the writing will be easy without requiring large movements along the ordinates, the same being said along the abscissas during the writing progression.

The movement field variation is always updated and set at the position X,Y in which at the moment the mouse or the finger is laid on the self-writing "keypad" auto-writer means, so since that moment, the movements for the writing are detected (dy, dx).

To improve the writing mode it will be possible to adopt DY, DX incremental movement functions thus avoiding that during the movement of adding a character, what previously already determined gets modified for example with DY=DX movement that is with relative movement at 45°.

One could change the character or to add a new one, depending on the level of additional differential increase ratio DY/DX. If the resultant of movement relative to the ratio between the differential increments was for example from the vertical (ordinates) <45° one would have a character change (from "a" to "z" or from "0" to "9") downwards and vice-versa, while with a >45 angulation one would have a character addition, vice-versa for the cancellation.

Analogously solely a comparison of DX character change field and a comparison DY of character non-change but only addition or cancellation can be provided.

DX will be conveniently included between 2 and 4.

The compared movement preferential scheme will be shown in the following chart, where the values −1, +1, +2, +3, are indicative and in any way variable and/or adaptable to the speed and sensitivity of the orthogonal movement device and to the sensitivity and precision of the operator's hand.

In fact, once the excursion parameters are established, carrying out a more or less wide movement, to write what one wants will be sufficient. From the tests amplitudes of maximum 10 mm. are sufficient for the letters, and even less for the numbers.

It is understood in this way that the movement will be rectilinear for up-down and forward-backward segments, without any problem of following curves of letter or numerical characters shapes that results to be always complex.

Figure 4:
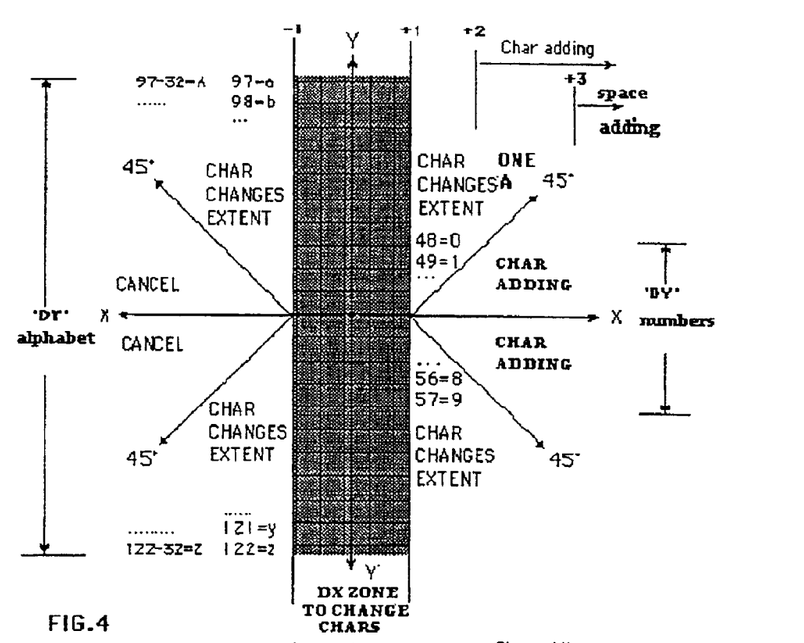
FIGS. 4 and 5 represent schematic relative writing diagrams.

The remarkably enlarged preferential representative scheme of the movement parameters is the following:

(See also FIG. 4)

For example to write the expression: "Avanzamento per", the movement chart results to be the following:

"avanzamento per"

Where the horizontal hyphens of the orthogonal movement are the spaces between a word and the other.

In fact if the chart is extended in correspondence of the writing all is clear, not requiring great advancements for the word writing:

"avanzamento per"

As it can be seen there is no complication of writing, in fact at the beginning the "a" for "advancement" appears on the screen, then moving downwards, the letters scroll very fast and one stops, at "v", then one goes up to "a", . . . and so forth until the word's end, then one proceeds with a light detachment and one begins the following word in the same way.

The paragraph end dots are completed by clicking on the sensor option key (1, MC, etc).

The same occurs for the writing of numbers, or of capital letters or punctuation by means of the option key assistance (1,MC)

Figure 1C:
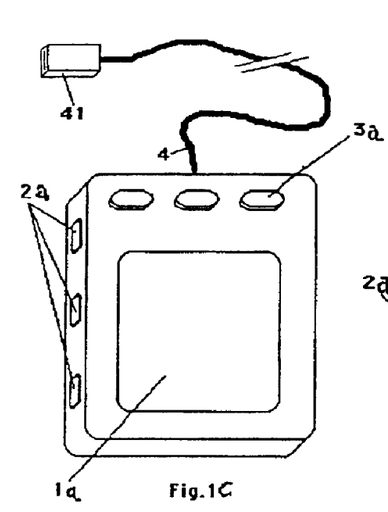
FIG. 1C is a schematic view of the auto-writer in a wire simplified version to write for example directly on a computer instead of using a keyboard.
Figure 2:
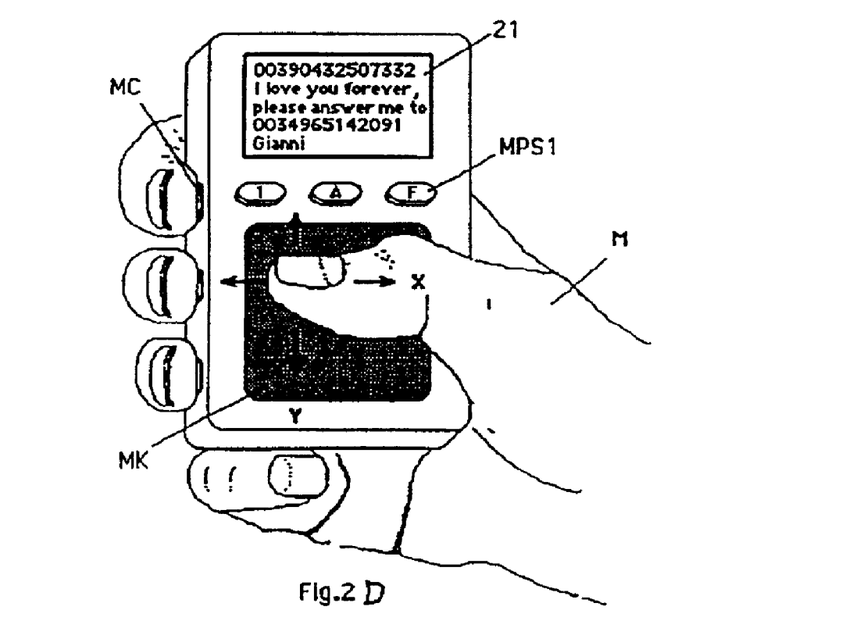
FIG. 2C is a view of an alternative solution with incorporated monitor, for example with independent computer function as for example for palmar, or cellular-phone, therefore wireless.
FIG. 2D is a view of a cellular-phone with integrated auto-writing system without keyboard.
Figure 2C:
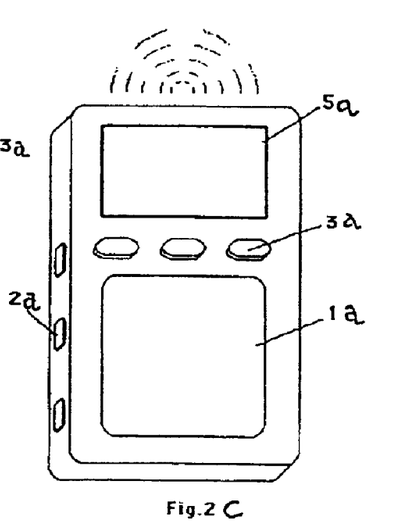
Figure 3C:
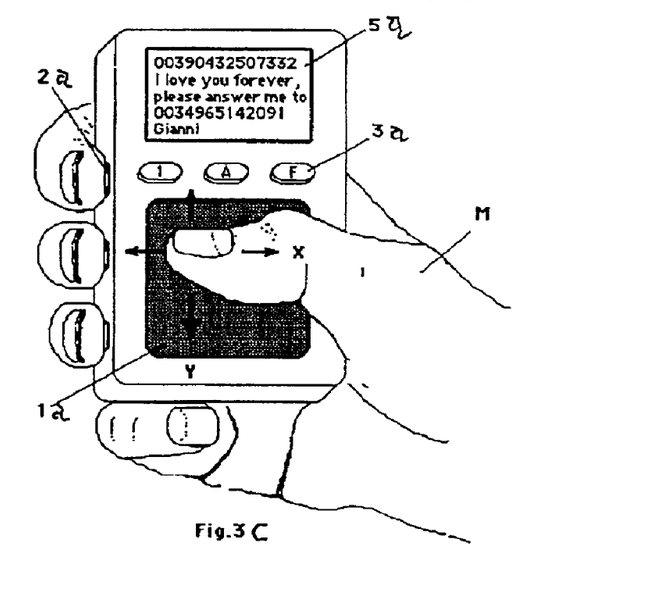
FIG. 3C is a view of how the auto-writer is used in the palms of the hand, for example to send an Email message by phone.

Referring to FIGS. 1C,2C and 3C.

Alphanumeric keypad is replaced by a small panel (keypad) sensitive to the thumb-sliding by electrostatic charges or by heat that afterwards sent by means of said electric wire, the electric resistance variation from a wire to another through said small panel (1a) that is at least connected with a switch (2a).

The wires are at least four, one brfekable by one of the push-buttons (2a) that acts as switch for the determination of the point in which one must click, the second, third and fourth for the function detection: one for X, one for Y and one for power-supply.

As shown by the figures, with 1a is indicated the thumb movement sensitive key-pad, with 2a the sideways option controls to be operated by the fingers opposite to the thumb, with 3a the front option controls to be operated by the thumb, alternatively to the sliding on the sensitive key-pad 1a. With 5a an optional screen to become a cellular-phone or wireless palmar, to phone, send messages by Internet, Fax etc., therefore also to write the telephone numbers, etc.

With 4a an optional cable fore the connecting to power, to computer, etc., with plug e.g. 41, a known remote control device (airport), also being able to be provided in alternative.

In the case of FIG. 3 it can be seen that the push-buttons 2a are at least one (preferably three), e.g. for punctuation functions, cancellation in association to the leftwards movement, addition of space for rightwards new word, capital letters or small letters, etc.

While the front push-buttons are at least three: one for the numbers, one for the letters and one for the functions of starting, switching-off, punctuation, language, sending messages, settings, etc.

In the case of functions activation they are found as occurs with the cellular-phones but instead of using upwards and downwards key-caps, the upwards and downwards thumb is always used in a noticeably simpler and less complicated manner, while rightwards one enters in the tree sub-functions and leftwards one exits tree-like until the main menu.

In this way the complexity of the writing key-caps and functions choice is completely avoided and all becomes simpler.

Furthermore for a telephone it will be sufficient at first to write the number in the first line and next to write the message e.g.:

00390432507332 bbg@server.dagostini.it

I love you forever

Etc.

and next to press a return key for example correspondent to the right-hand functions key.

Vice-versa to receive messages, also from a cellular-phone or from a palmar.

The same device, as said can also control a computer and writing on the computer or even the television monitor.

Referring to FIG. 3C:

with 1 the numbers writing option button is indicated and, with "A" the letters writing button (between the capital and the small letters, the processor determines it or a side option button (2a) is indicated;

with "F" the functions button, then being able to select them from (1a) by thumb sliding is indicated.

Also a switch-on and switch-off push-button "I/O", and, even if not necessary a return one e.g. "OK" (not illustrated but of known art) can be provided.

Referring to FIGS. 1D and 2D, the movement sensor system: "mouse" or thumb finger sliding sensor key-pad, carries out the writing control function instead of the keyboard.

In FIG. 1D the computer can function without keyboard and without keyboard one can write on it by said "mouse" (MK), on the monitor or screen (21) of the computer itself (2d) that for this purpose can have everything integrated behind the monitor itself (21) and with insertion of the compact disc "CD" sideways (CD), because it is a substantially flat screen.

In FIG. 2D a cellular-phone or palmar is shown with the same technology where the mouse (MK) is replaced by a "Finger Sensor Key-Pad" that is a finger movement sliding sensor (thumb); having above the same LCD screen only smaller (22) and with "mouse" option controls (MC) sideways rather than toward the bottom for operating by the fingers for suitable options, such as (letters: vowels and consonants, different characters e.g. punctuation, capital small, letters and numbers, etc.; aid to the cancellation in retrocession "X", aid to the addition of new word in advancement "X", exit from the writing condition, etc.

Other screen function key-caps (MPS1) of known art being provided.

In relation to what written at least concerning the word in writing progress and at least the former word, the automatic completion of the word in writing progress or at least the limitation of the subsequent possible options is carried out depending on both.

Said option means are push-buttons placed over and/or under said sensible panel, in order to be able to be operated by the same hand that operates said movement sensor.

Said option means are direction dynamic variations of the said movement sensor.

Said option means provide the activation of means for the reduction of the variables to write in sub-groups.

Said sub-groups are at least vowels and consonants.

Said option means include or not the cancellation activation.

Said option means include or not the activation of the beginning addition alternated with the characters continuous addition.

The word beginning may be chosen between variables of two characters to then be inserted in the variability automatic process driven by the processor, in this way the most of the alphabet variables that unavoidably are present initially are eliminated.

The system proposes the beginning of the most plausible letters and the completion only of the most plausible words of the sentence in function of the already written words, in this way the variables are further reduced, so for example after "Egli" (pronoun) certainly there won't be written a noun and therefore the variables of the words that are only nouns can be excluded from the proposal, etc. The utilized technology being that of the automatic translation e.g. PCT-IT99/00040 (D'Agostini).

Figure 5:
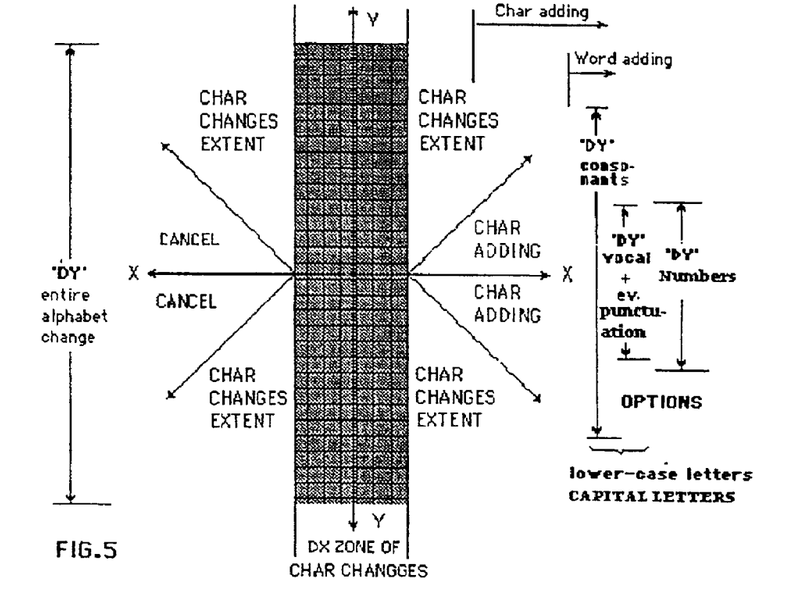

(See also FIG. 5)

The following scheme synthesizes the system and the operating way:

Where in this case the numeral references "chartonum" or "numtochar" are not relevant, putting the variables sequences according to the wanted and desired system in function of the Y increase or reduction or of DY prevalence.

Advantageously the system provides:

a visualized vertical band DX in correspondence with the character to modify for visual controlling of the scrolling action;

the division into different groups of the characters to scroll by mouse-up and mouse-down option.

What is claimed is:

1. An auto-writing system on monitor/screen, controlled by microprocessor characterized in that it provides:

the replacement of the writing alphanumeric keyboard, with an auto-writing device including a movement sensor according to the X,Y coordinates with respect to a surface, associated/able to said microprocessor that controls said monitor/screen, in which:

with vertical or predominantly vertical movements according to the "Y" ordinates, allow selecting an alphanumeric character by changing in scrolling-way the alphanumeric characters of interest, so that, when the movement stops or changes direction, the selected alphanumeric character remains on the screen;

with horizontal or predominantly horizontal movement, according to the abscissas "X" axis, in the sense of advancing writing, at least the addition of said alphanumeric character that has been selected with the vertical scrolling-way movement is operated.

2. An auto-writing system according to claim 1, characterized in that in the prevailing movement according to the X-abscissas axis:
   in the advancing direction alphanumeric characters and punctuation is added and
   in the opposite direction, that is backwards, cancellation is made.

3. An auto-writing system according to claim 1, characterized in that it comprises automatic conversion means of the numerical value of "numtochar" ordinate into opportune character/punctuation, in relation to the already written prior characters/punctuation.

4. An auto-writing system according to claim 1, characterized in that it provides at least one integrated dictionary that as one writes the characters of a word, compares what written with the prefixes of the words existing in said dictionary and, when the word or words identified suggest sequentially the limited options allowed by said dictionary.

5. An auto-writing system according to claim 1, characterized in that said movement sensor small panel is a "keypad" pseudo-writer means, that is a small panel sensor of the movement of the rested finger and made scroll over it in a rectilinear or almost rectilinear manner by segments.

6. An auto-writing system according to claim 5, characterized in that said "keypad" pseudo-writer means movement sensor small panel, is structured and sized for being housed in the palm of the hand and operated by the same hand-thumb movement.

7. An auto-writing system according to claim 1, characterized in that said movement sensor is essentially a mouse.

8. An auto-writing system according to claim 1, characterized in that the movement parameters substantially fall within the scheme of a x-y coordinates diagram where values lioaits of side excursion −1, +1 +2, +3 can vary according to wanted tolerances.

9. An auto-writing system according to claim 1, characterized in that it works with to-and-fro movements for more or less continuous rectilinear segments upwards and downwards, forwards and backwards substantially forming a chart of the type with upwards and downwards oscillations whose direction variations correspond to determined characters.

10. A cellular-phone structured with the system as in claim 1 equipped with a thumb movements sensor small panel instead of a writing pad.

11. A cellular-phone according to claim 10, characterized in having at least one writing option control means on the side on the thumb's opposite side, to be operated by using the fore finger or the middle finger.

12. A palmar computer characterized in having a thumb's movements, sensor small panel and in being integrated with auto-writing system according to claim 11.

13. A telephone structured with the self-writing system as in claim 9 endowed with a finger movements sensor small panel instead of the writing key-pad or combinatorial disc.

14. An operatively structured computer including the auto-writing system according to claim 13.

15. A sensor small panel linkable to a monitor/screen or television integrated with self-writing system, according to claim 9.

16. An auto-writing hardware endowed with a system according to claim 1, with processor means an memory means and means for sending control signals to a screen/monitor and relative X,Y movement sensitive means for detection a body in motion on it or vice-versa, having the size for being contained in the palm of one's hand, characterized in that the aforementioned means are associable with storage means at least of the last two written characters in the case of letters and limiting means of the variety of letters to write in relation to the previously already written characters.

17. An auto-writer using and auto-writing system according to claim 16, characterized in that it comprises a panel sensitive to the finger sliding, at least a hand's thumb that holds the device, that is shaped to have said optional controls at least on a side opposite to the palm of the hand that holds it, to be controlled by the fingers, forefinger and/or middle finger and/or annular finger, while the thumb is intended to slide on said panel, upwards and downwards to vary the characters and forwards and backwards for adding or for canceling them.

18. An auto-writer according to claim 17, characterized in that it comprises controls with option and/or control push-buttons, on and/or under said sensitive panel, to be able to be operated by said thumb.

19. An auto-writer according to the features of claim 18, characterized in that it comprises at least one microprocessor, writing storage means and management means of the same, with displayer of what is written and means of sending and receiving signals to a stand-alone monitor/screen apparatus.

20. An auto-writing system associated to microprocessor and to at least one movement sensor means, at least for sending control signals to a monitor/screen showing a moving pointer, and detection means of said moving pointer respect to the orthogonal co-ordinates X,Y of said monitor/screen, on which to write, according to claim 19, wherein:
   said movement sensor means has the size to be contained in one hand's palm;
   and said system includes at least:
   means to detect the relative sliding movement on sensor key-pad means into a virtual pointer in displacement on said monitor/screen in the writing area, in order that:
   with prevailing movement according to the horizontal abscissas "X";
   characters are added if the displacement lies in the direction of the addition to the writing and
   characters are inversely cancelled;
   with prevailing movement according to the vertical ordinates "Y" the characters are made vary in an increasing manner if downwards and in a decreasing manner if upwards;
   option means to write alternatively at least:
   letters: capital or small ones, vowels and consonants, and punctuation/numbers;
   control means to activate at least two successive dots of the sliding movement in association to the relative position on said co-ordinates "X1, Y1; X2, Y2" to decide if to vary the written character/punctuation or to add one or to cancel it;
   control means to bring up to date continuously the position of said pointer on the screen in order to feel its relative dynamic movement;
   and in which in the case of letters the aforementioned means are associable to:
   memorizing means of the characters already written, and
   comparison means of the characters sequence 1 to n of what is already written at least of the last word with the words of a dictionary in memory M, characterized in that it further provides:

to select the only words of the dictionary M that begin exactly with the characters from 1 to n of what is already written;

to memorize this group of words M1 generally minor than the former M;

and to memorize the not repetitive sequence of the characters n+1 of this reduced group of words M1, for automatically during said movement of said sensor means according to the ordinate "Y", to write sequentially, one or the other of these letters as reduced variables with respect to the entire alphabet by selection with said movement "Y";

to repeat the process with addition of letters by means of said movement "X" and respective selection of the new reduced set "M2" ... "Mn" until the reducing action of the alternative dictionary words Mn is identified with only one alternative for the automatic completion of the word in writing.

21. A system according to claim 20, characterized in that in relation to what is written at least concerning the word in writing progress and at least the former word, the automatic completion of the word in writing progress or at least the limitation of the subsequent possible options is carried out depending on both.

22. A system according to claim 21, characterized in that said option means are push-buttons placed on and/or under said sensible panel, in order to be able to be operated by the same hand that operates said movement sensor.

23. System according to claim 20, characterized in that said option means are direction dynamic variations of said movement sensor.

24. System according to claim 20, characterized in that said option means provide the activation of means for the reduction of the variables to write in sub-groups.

25. A system according to claim 24, characterized in that said sub-groups are at least vowels and consonants.

26. A system according to claim 20, characterized in that said option means include the activation or not of the cancellation.

27. A system according to claim 20, characterized in that said option means include the activation or not of the starting of word adding with contemporaneously two characters, alternated with the one character continuous addition.

28. A system according to claim 20, characterized in that the word beginning is allowed with alternative choice between variables of two characters selected in a sensor panel position, to then being inserted in the variability process driven by the processor.

29. A system according to claim 20, characterized in that the system is provided to propose the beginning of the most plausible letters and the completion only of the speech/phonetic-most-plausible words in function of the words already written stored in respective dictionary divided by prefixes of at least two letters.

30. A system according to claim 29, characterized in that it provides a visualized vertical band DX in correspondence with the letter to modify for visual controlling of the scrolling action.

31. A system according to claim 30, characterized in that it provides the division into different groups of the characters to scroll by mouse-up and mouse-down option.

* * * * *